(12) United States Patent
Pai et al.

(10) Patent No.: US 6,612,888 B1
(45) Date of Patent: Sep. 2, 2003

(54) PACKAGING METHOD OF ELECTROLUMINESCENCE DEVICES

(75) Inventors: Jui-Fen Pai, Nantou (TW); Yi-Hung Chou, Hsinchu (TW); Yung-Yuan Chen, Kaohsiung (TW)

(73) Assignee: Delta Optoelectronics, Inc., Hsinchu (TW)

( * ) Notice: Subject to any disclaimer, the term of this patent is extended or adjusted under 35 U.S.C. 154(b) by 619 days.

(21) Appl. No.: 09/611,567

(22) Filed: Jul. 7, 2000

(30) Foreign Application Priority Data

Mar. 30, 2000 (TW) ....................................... 89105912 A (51) Int. Cl.⁷ ............................................. H05B 33/10
(52) U.S. Cl. ......................................... 445/24; 438/126
(58) Field of Search ........................... 445/24; 349/189, 349/190; 438/127, 126

(56) References Cited

U.S. PATENT DOCUMENTS

| | | | |
|---|---|---|---|
| 5,677,749 A | * 10/1997 | Tsubota et al. | 349/160 |
| 6,095,203 A | * 8/2000 | Yamamoto et al. | 141/59 |
| 6,271,907 B1 | * 8/2001 | Masaki et al. | 349/189 |
| 6,351,030 B2 | * 2/2002 | Havens et al. | 257/690 |
| 6,398,610 B1 | * 6/2002 | Inoue | 445/66 |

* cited by examiner

Primary Examiner—Kenneth J. Ramsey
(74) Attorney, Agent, or Firm—J. C. Patents (57) ABSTRACT

A packaging method of electro-luminescence devices. By controlling the moisture and oxygen in an environment, a glass substrate with electro-luminescence devices and a glass covering plate corresponding thereto are provided. A frame glues with an opening is applied on each frame on the glass plate that corresponds to each electro-luminescence device on the substrate. The glass plate is laminated with the glass substrate via the frame glues. The glass substrate is cut into individual package including an electro-luminescence device enclosed by a part of the glass substrate, a part of the glass plate and the frame glue except that a side thereof is exposed to the environment via the opening. Each of the packages is disposed in a vacuum cavity with the opening facing the packaging material in a glue tub in the vacuum cavity. The pressure of the vacuum is raised up to a certain value to have the packaging material filling the cavity containing the electro-luminescence in the package. The packaging material is then cured.

42 Claims, 14 Drawing Sheets

PACKAGING METHOD OF ELECTROLUMINESCENCE DEVICES

CROSS-REFERENCE TO RELATED APPLICATION

This application claims the priority benefit of Taiwan application serial no. 89105912, filed Mar. 30, 2000.

BACKGROUND OF THE INVENTION

1. Field of the Invention

The invention relates in general to a packaging method of electro-luminescence (EL) device. More particularly, this invention relates to a packaging method of organic electro-luminescence (OEL) devices.

2. Description of the Related Art

The research of electro-luminescence starts in 1960. Organic compounds have been used as the luminescence layer in an organic electro-luminescence device. Typically, the luminescence layer is sandwiched by an top metal electrode and a bottom transparent anode. According to the types of organic electro-luminescence materials, devices such as organic light-emitting diodes (OLED) and polymer light-emitting diodes (PLED) have been developed. In early eighties, the Kodak company in the United States used tri-(8-hydroxyquinoline)aluminum ($Alq_3$) as the luminescence layer with the insertion of a hole injection layer between the luminescence layer and the anode to enhance the recombination efficiency. The applicability of the organic electro-luminescence devices is thus confirmed. In 1990, the University of Cambridge fabricated organic light-emitting diodes using conjugated polymer such as poly(p-phenylene vinylene) (PPV). Since the material of poly(p-phenylene vinylene) has the characteristics similar to a semiconductor, and a polymer light-emitting diode can be formed with a simple fabrication process, a second trend of research was evoked. Characteristics of the organic electro-luminescence such as self-luminescence, wide vision angle (up to 160°), high response speed, low driving voltage, full color have been put in practical use such as small display panels, outdoor display panels, computer and TV screens.

As mentioned above, two types of devices, organic light-emitting diodes and polymer light-emitting diodes have been developed. The efficiency and working lifetime depend on the organic material properties, fabrication process parameters and the environment parameters of fabrication process. Furthermore, a good package is a crucial factor to maintain the device performance. In the technique point of view, currently, the material synthesis and the development of fabrication process have been commercialized. However, a quick and effective packaging method is still under development to hold the organic electro-luminescence devices in the stages of experiment or prototype without stepping into a mass production stage.

Figure 1A:
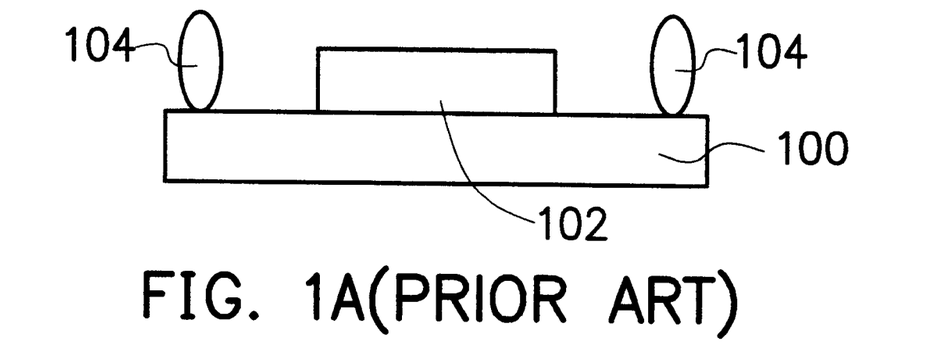
FIGS. 1A–1B illustrate a conventional packaging method for an organic light-emitting diode.
Figure 1B:
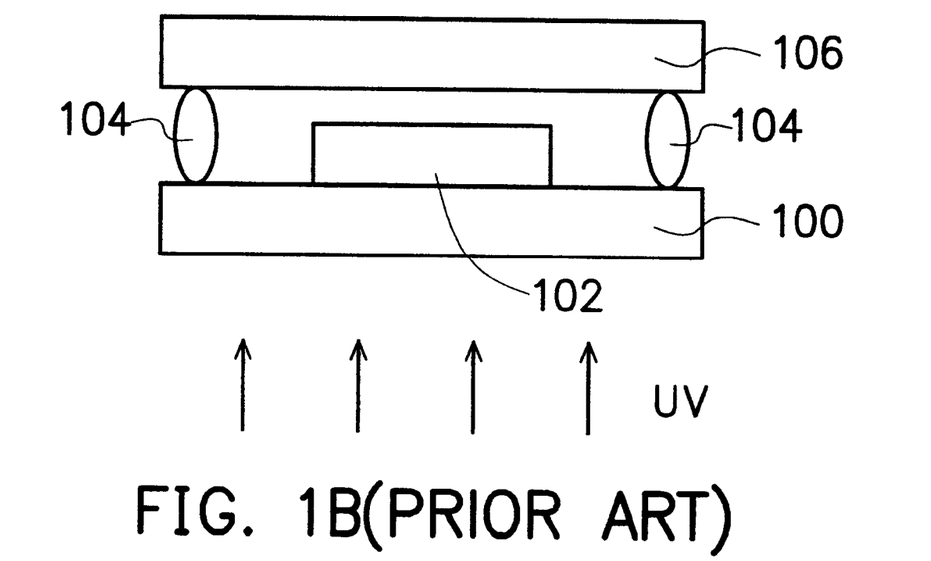

FIG. 1A and FIG. 1B shows a conventional packaging method for an organic electro-luminescence light-emitting diode. In FIG. 1A, a glue bumping machine is used to coat an ultra-violet glue (UV glue) 104 at a peripheral of an organic light emitting diode 102 on a glass substrate 100. In FIG. 1B, a glass plate 106 is laminated with the glass substrate 100 via the UV glue 104 to cover the organic light-emitting diode 102. An ultra-violet light is used to shine on and cure the UV glue 104, the package of the organic light-emitting diode 102 is thus completed.

Figure 2A:
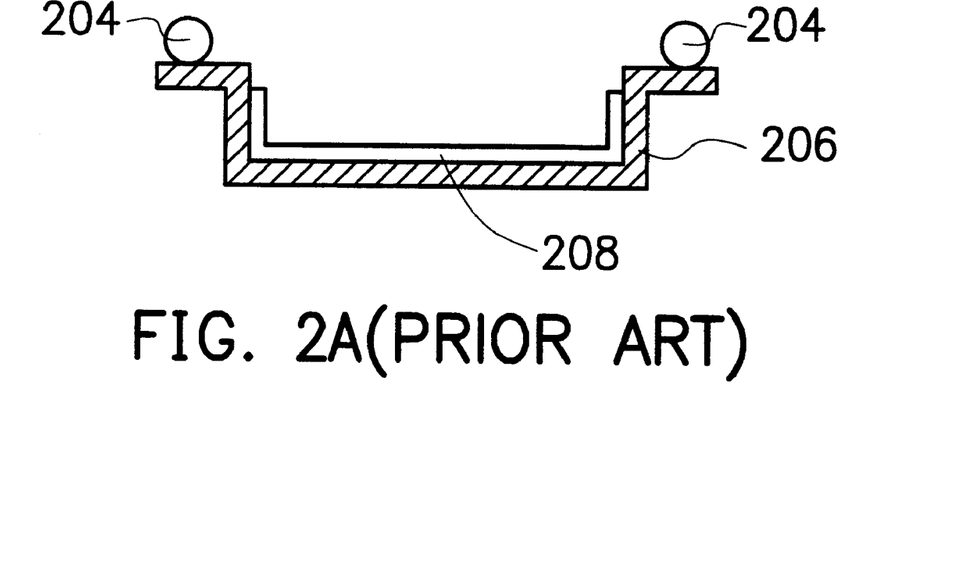
FIGS. 2A–2B illustrate another conventional packaging method for an organic light-emitting diode.
Figure 2B:
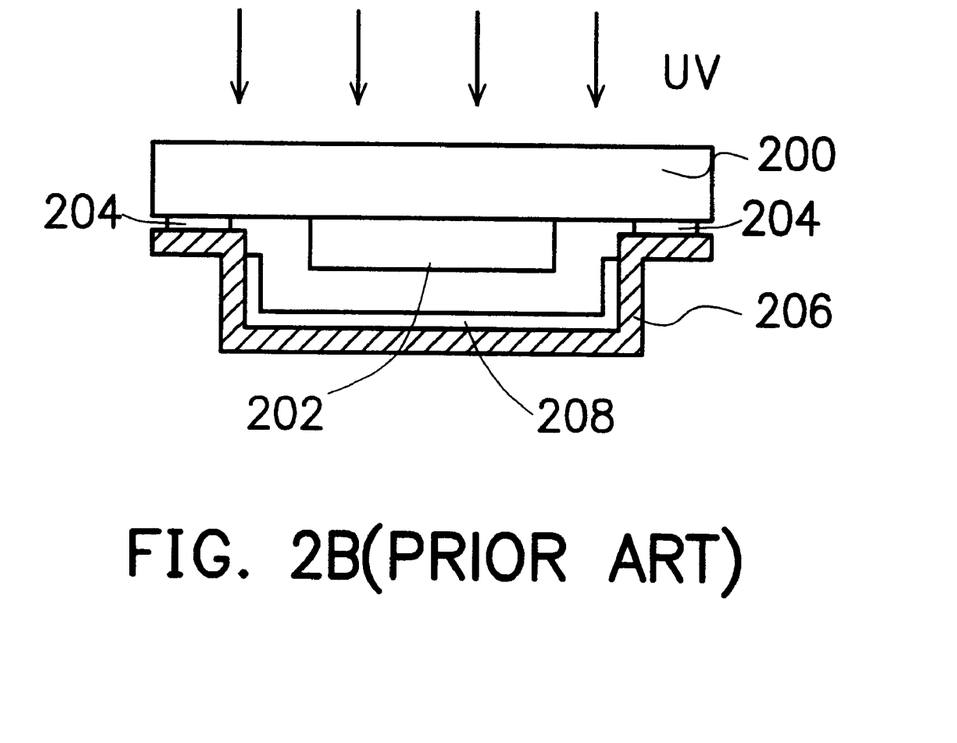

FIG. 2A to FIG. 2B shows another conventional packaging method of organic light-emitting diodes. In FIG. 2A, a drawing metal lid 206 is disposed on a gauge (not shown). Using a glue bumping machine to coat an UV glue 204 on an edge of the metal lid. A moisture absorption sheet 208 is formed on an inner surface of the metal lid 206. The metal lid 206 in the gauge is positioned at which a light-emitting device on a glass substrate is to be packaged. In FIG. 2B, a glass substrate 200 with an organic light-emitting diode 202 is laminated with the metal lid 206 via the UV glue 204. Using an UV light to shine on the UV glue 204, the organic light-emitting diode 202 is thus packaged in the glass substrate 200 and the metal lid 206.

Both of the above packaging methods can be applied in manufactures for mass production. However, by simply using the UV glue cannot block the external moisture and oxygen. Without effectively blocking the external moisture and oxygen, the device quality and performance are thus seriously affected. Moreover, to use the UV glue at a peripheral of the light-emitting device on the glass substrate, a positive pressure, that is, a pressure larger than the atmosphere, is required within the package, for example, highly pure nitrogen can be filled. Nevertheless, this is not easy to achieve with additional fabrication cost. In addition, the production efficiency is also affected to reduce the yield of products.

Figure 3A:
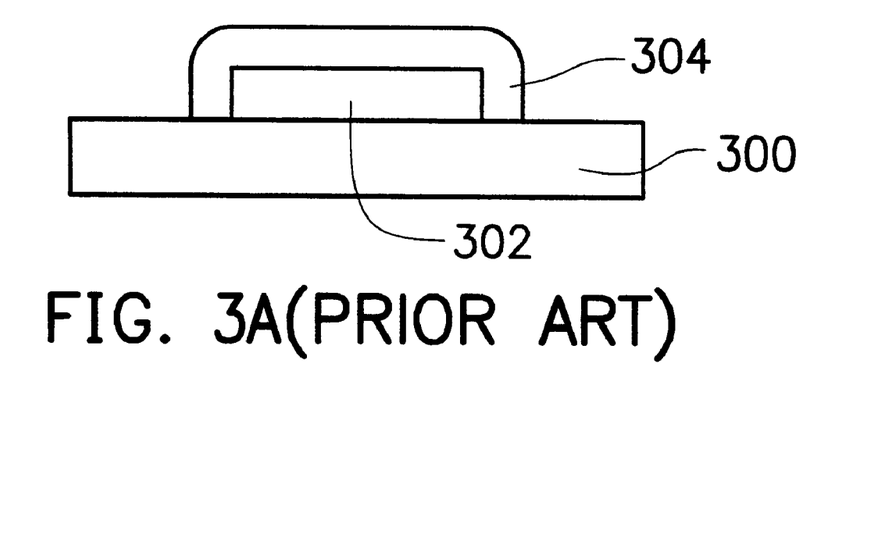
FIGS. 3A–3B illustrate another conventional packaging method for an organic light-emitting diode.
Figure 3B:
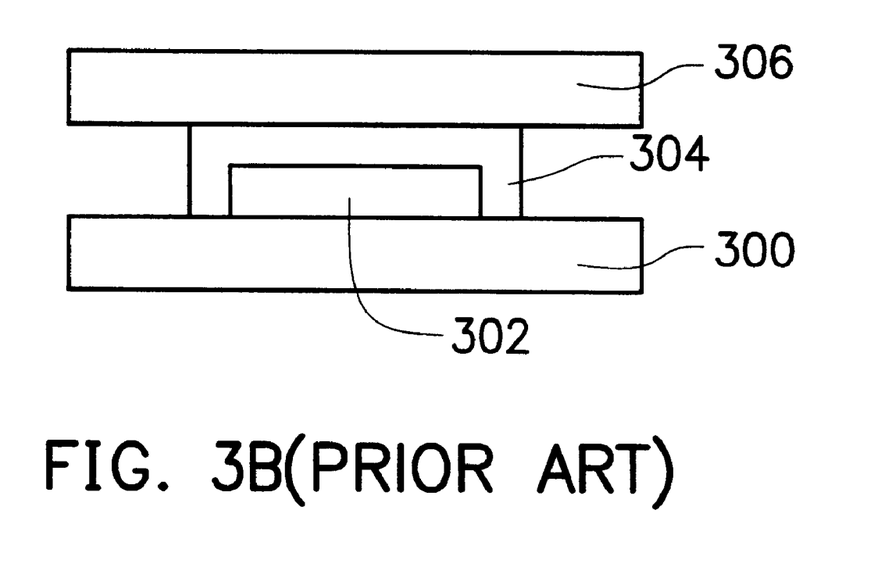

FIGS. 3A to 3B further show another conventional packaging method for an organic light-emitting diode. In FIG. 3A, a glass substrate 300 comprising an organic light-emitting diode 302 is provided. A glue bumping machine is used to coat an epoxy resin (so-called AB glue) 304 on a surface of the organic light-emitting diode 302. In FIG. 3B, a glass plate 306 is used to cover the organic light emitting diode 302 and laminated with the glass substrate 300 via the epoxy resin 304. The epoxy resin 304 is then naturally cured to complete the package of the organic light-emitting diode 302.

The packaging method applies the epoxy resin 304 all over the organic light-emitting diode 302. A better packaging effect is achieved. One drawback of this kind of packaging method is that the uniformity of the epoxy resin is difficult to control for mass production. In addition, while laminating the glass substrate and the glass plate or a metal lid, an overfill of the epoxy resin occurs to cover the wiring connection between the organic light-emitting device and external devices. Thus, the organic light-emitting diode cannot be functioned properly. In addition, bubbles are easily formed between the epoxy resin and the glass plate during lamination to give rise of other side effects.

SUMMARY OF THE INVENTION

The invention provides a packaging method for an electro-luminescence device to effectively block external moisture and oxygen, so as to prevent quality deterioration and performance degradation of the electro-luminescence devices. In addition, the packaging method provided by the invention provides a high production efficiency and a product yield with reduced fabrication cost, so that the mass production can be achieved. More specifically, the problem of glue overfilling between the covering plate and the substrate is resolved. This method is particularly applicable of the packages for mass production of organic light-emitting diodes.

In the packaging method provided in the invention, a glass substrate with organic electro-luminescence diodes and a glass plate is provided. The moisture and oxygen for fabrication environment is controlled. At a peripheral of the glass plate, a frame or peripheral glue is coated to enclose the organic electro-luminescence diode after the glass plate is laminated with the glass substrate. The peripheral glue is opened with an opening. The opening is to be positioned on the glass substrate at which there is no circuit. The glass plate and the glass substrate are then laminated via the frame glue, and the frame glue is then cured. The substrate is then cut to separate individual electro-luminescence device packaged by the glass plate and the frame glue. The package of the electro-luminescence device is then disposed into a vacuum cavity. When the pressure of the vacuum cavity reaches a certain value, the glass substrate is immersed into a glue tub in the vacuum cavity. The opening is thus in contact with a packaging material. The pressure is raised to cause a pressure difference between the vacuum cavity and the cavity enclosed by the peripheral glue between the glass substrate and the glass plate. Therefore, the space is filled with the packaging material. The organic electro-luminescence device is thus encapsulated with the packaging material. The packaging material is then cured in the next step.

Both the foregoing general description and the following detailed description are exemplary and explanatory only and are not restrictive of the invention, as claimed.

DESCRIPTION OF THE PREFERRED EMBODIMENTS

First Embodiment

Figure 4:
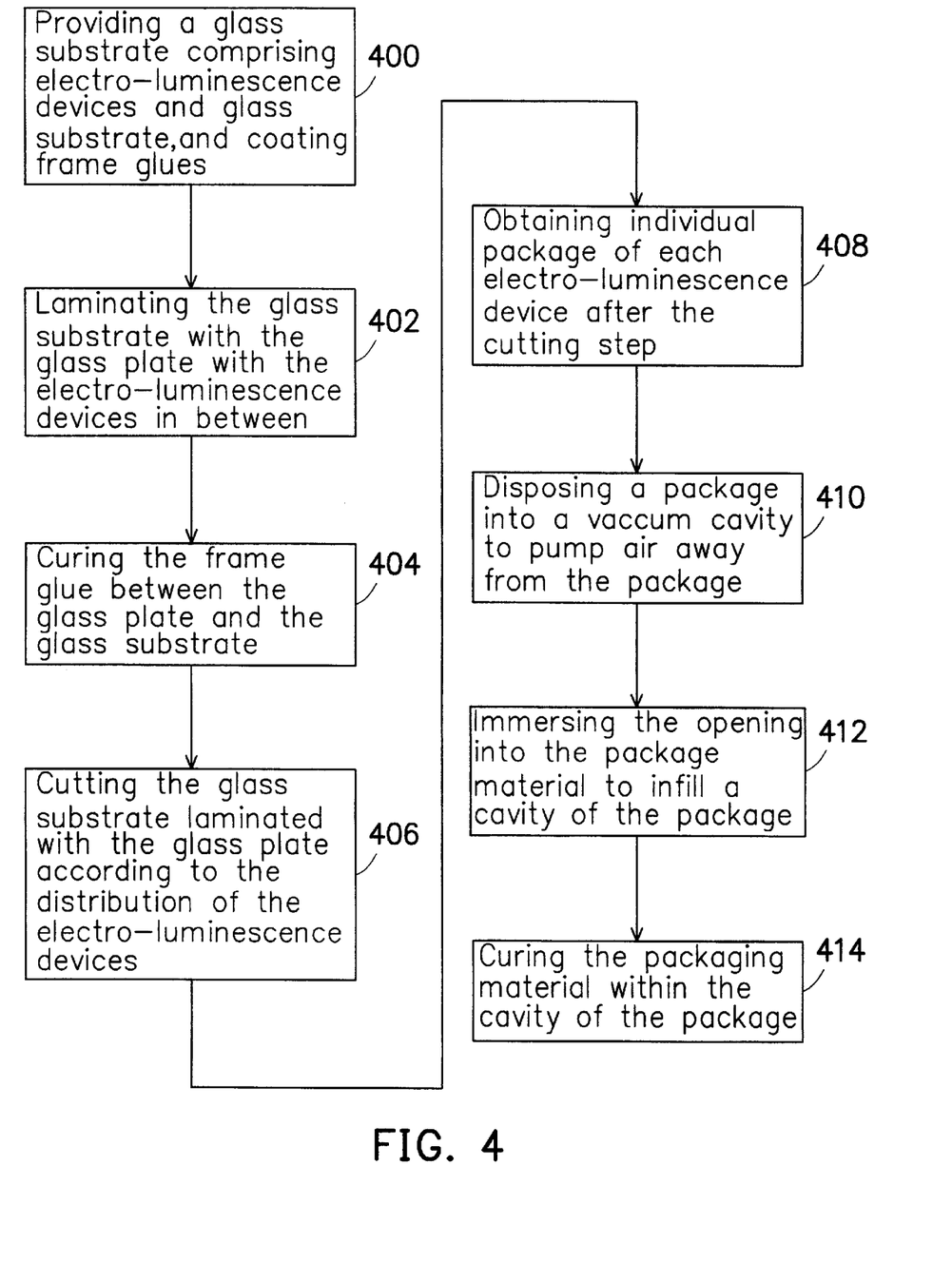
FIG. 4 shows a process flow of a packaging method in a first embodiment of the invention.

FIG. 4 shows a process flow of packaging an electro-luminescence device according to a first embodiment of the invention. FIG. 5A to FIG. 5H shows the packaging process of the electro-luminescence in the first embodiment. The steps 400 to 414 illustrated in FIG. 4 are corresponding to the steps as shwon in FIG. 5A to FIG. 5H, respectively.

Figure 5A:
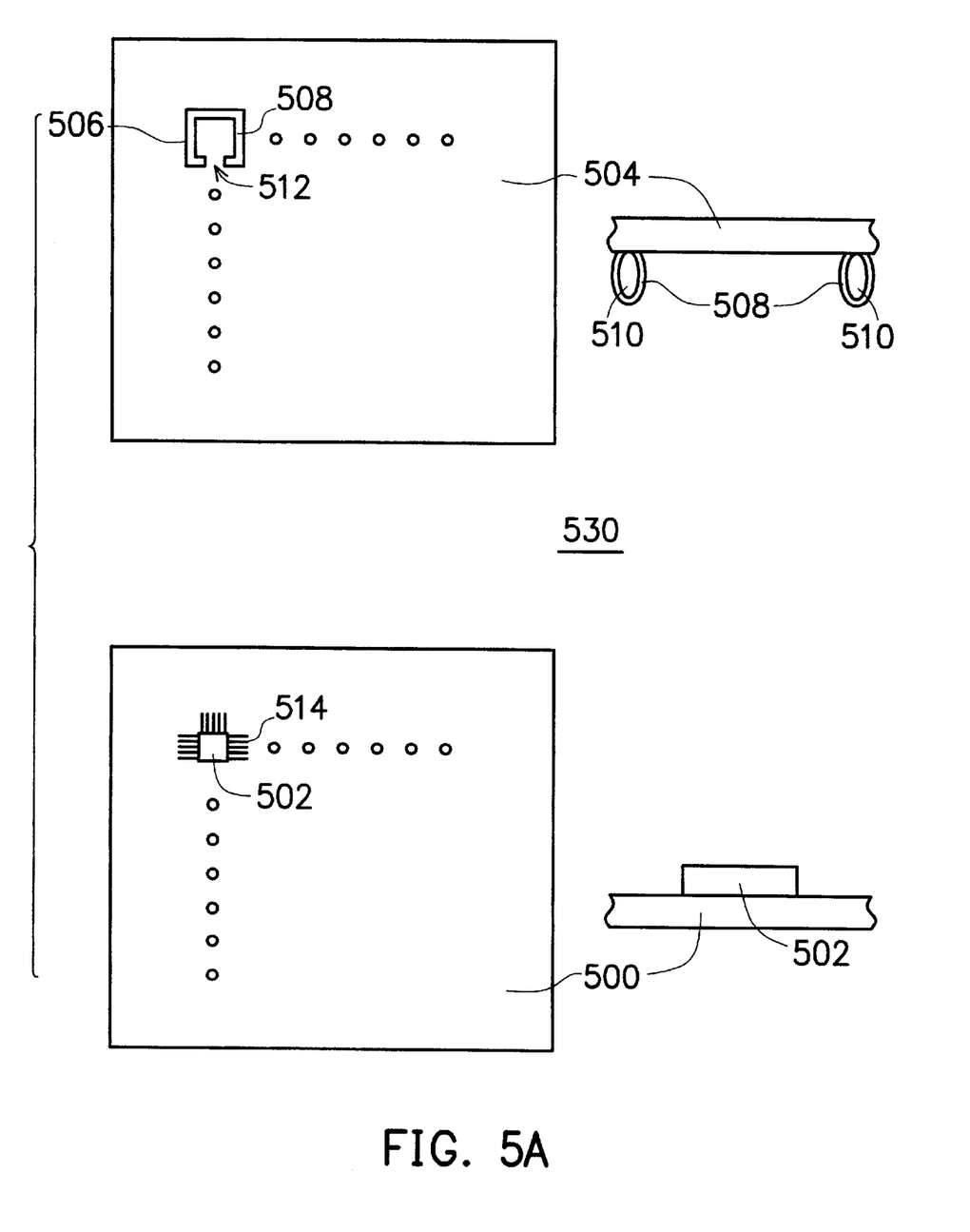
FIGS. 5A–5H show a packaging process of an electro-luminescence device.

As shown as the step 400 in FIG. 4 and FIG. 5A, in an environment 530, the moisture and oxygen concentrations are controlled, for example, under 1 ppm. The environment includes, for example, a dry box. A glass substrate 500 comprising an electro-luminescence device 502 and a glass plate 504 are provided. Frame or peripheral glues are formed on the glass plate 504. Each of the peripheral glues 508 is positioned to enclose each of the electro-luminescence devices after the glass plate 504 is laminated with the glass substrate 500 with the electro-luminescence devices in between. In addition, an opening 512 is formed on one side of each frame glue 508 to align with one side of each corresponding electro-luminescence device 502 on which no circuit is formed.

FIG. 5A shows both top views and cross sectional views of the glass substrate 500 and the glass plate 504. Spacers 510 are included in the frame glues 508. The material of the frames glues 508 comprises, for example, thermal curing glue such as AB glue and ultra-violet curing glue such as UV glue.

Figure 6:
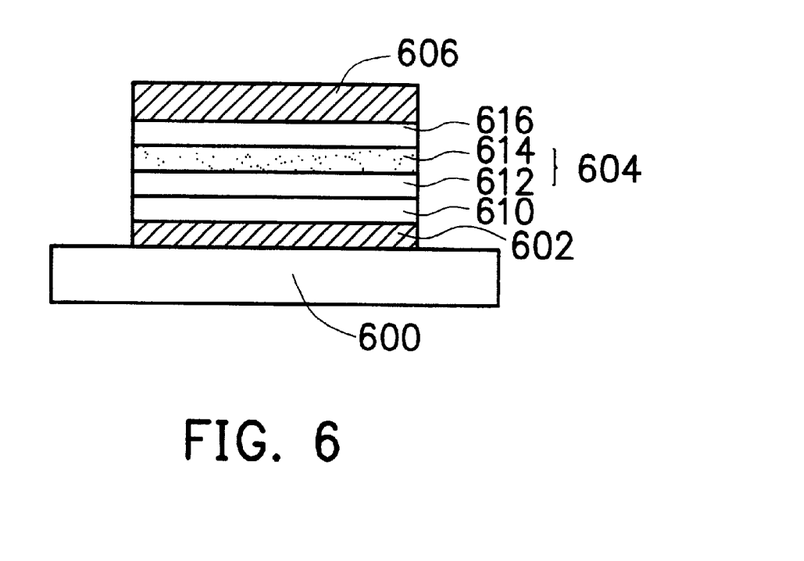
FIG. 6 shows a cross section of a glass substrate comprising an organic light-emitting diode.

The electro-luminescence devices 502 comprise, for example, organic light-emitting diodes. In FIG. 6, a cross sectional view of the glass substrate 500 comprising the organic light-emitting diode 502 is shown. On the glass substrate 500, an indium tin oxide (ITO) 602 is formed and patterned. An organic thin film 604 is formed on the indium tin oxide layer 602. A metal electrode layer 606 is formed on the organic thin film 604. The organic thin film 604 farther comprises a hole injection layer 610, a hole transport layer 612, a light emitting layer 614 and an electron transport layer 616.

Figure 5B:
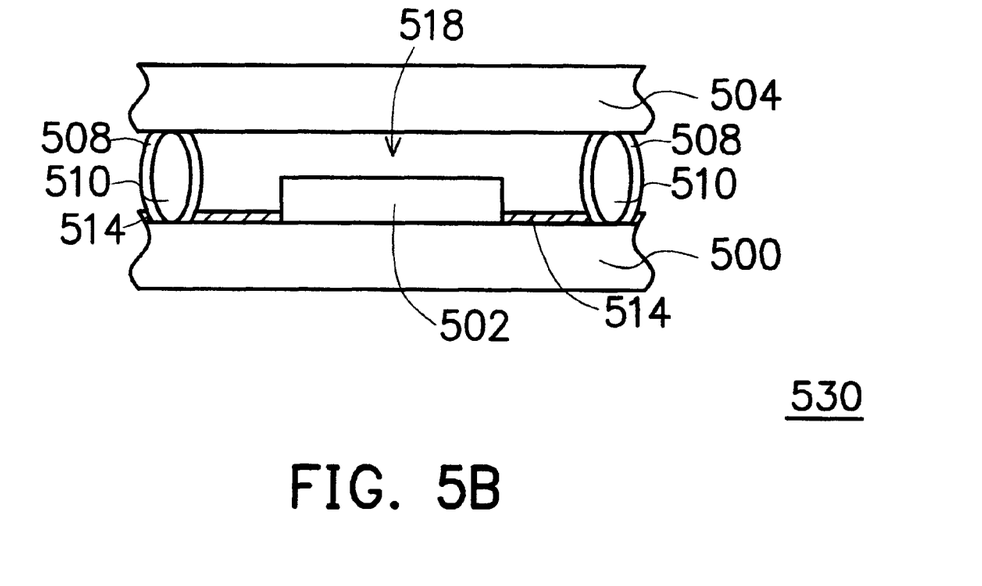
Figure 5C:
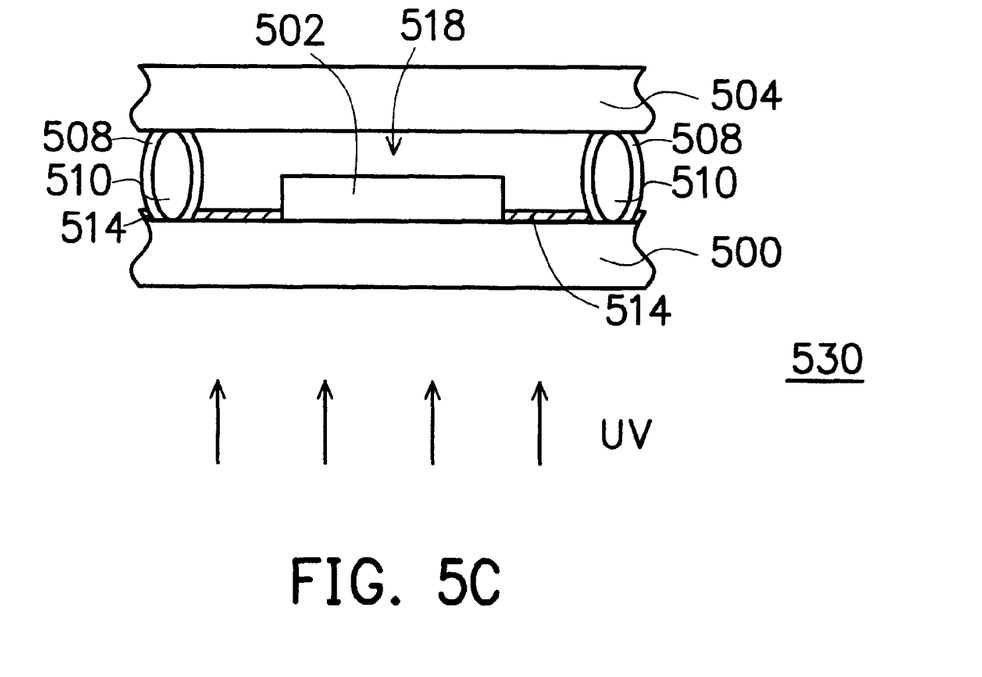

FIGS. 5B to 5C shows the cross sectional views for packaging one of the electro-luminescence devices 502.

Referring to the step 402 in FIG. 4 and the step as shown in FIG. 5B, the glass plate 504 is laminated with the glass substrate 500 in an environment 530 that the moisture and oxygen concentrations are under control. The frame glue 580 is used to laminate the glass plate 504 and the glass substrate 500, and the electro-luminescence device 502 is thus enclosed by the frame glue 580. Yet, the electro-luminescence device 502 has one side exposed to the environment via the opening 512. The spacer 510 included in the frame glue 508 is used to control the joint gap between the glass substrate 500 and the glass plate 504. While coating the frame glue 508, the addition of the spacer 510 maintains the distance between the glass substrate 500 and the glass plate at a certain value.

Referring to the step 404 in FIG. 4 and FIG. 5C, after the lamination of the glass substrate 500 and the glass plate 504 in an environment having the moisture and oxygen controlled, the frame glue 508 is cured. If UV glue is selected as the frame glue 508, an ultra-violet light is used to shine on the frame glue 508. If the thermal curing glue is selected, a thermal curing step is required. While laminating the glass plate 504 with the glass substrate 500, the surface of the glass plate 504 having the frame glue 508 is facing the surface of the glass substrate 500 having the electro-luminescence device 502. A positioning step is performed, that is, the glass substrate 504 is positioned to have the frame glue 508 surrounding the electro-luminescence device 502 while laminating. A step of UV light curing or thermal curing is performed to harden the frame glue 508. Or alternatively, the frame glue 508 is naturally cured after lamination.

Figure 5D:
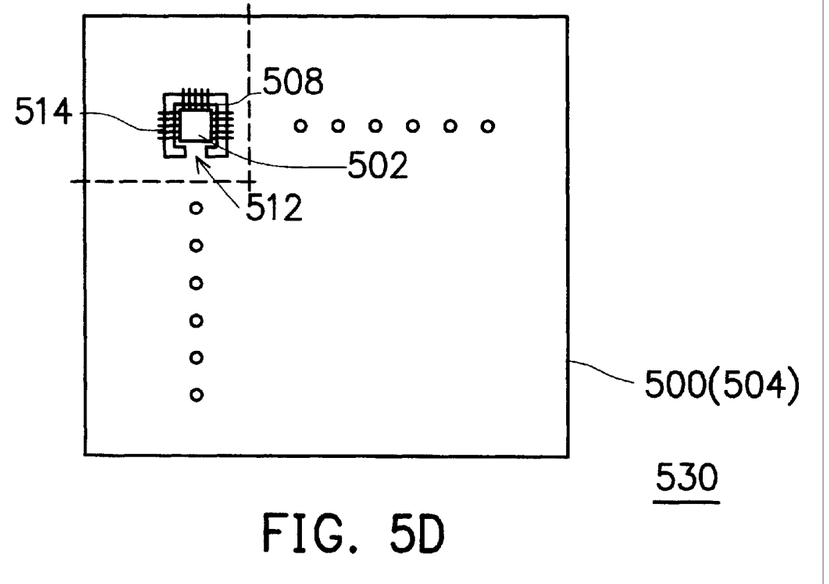
Figure 5E:
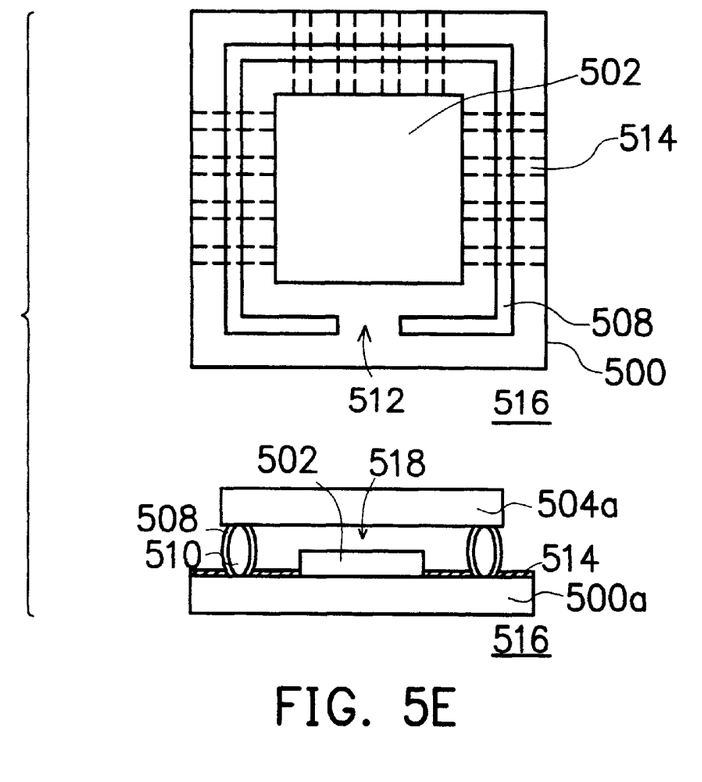

Referring to the step 406 in FIG. 4 and FIG. 5D, still in the environment 530 having the moisture and oxygen concentrations controlled, the glass substrate 500 is cut to by a cutting machine separate individual electro-luminescence devices 502. In FIG. 5E, the dash lines are the cutting lines for separating the electro-luminescence devices 502 from each other. After the cutting step, each electro-luminescence device 502 on the glass substrate 500a is packaged with the glass plate 504a via the frame glue 508, while one side of the electro-luminescence device 502 is exposed to the environment 530 via the opening 512. The cutting lines are designed without cutting the electrical circuits 514 between the electro-luminescence devices 502 and external devices. As shown in FIG. 5E, each electro-luminescence device 502 is sealed in a package 516. The package comprises the electro-luminescence device 502, the glass substrate 500a, the frame glue 508, the glass plate 504a and the cavity 518 enclosed by the glass substrate 500a, the frame glue 508 and the glass plate 504a.

Figure 5F:
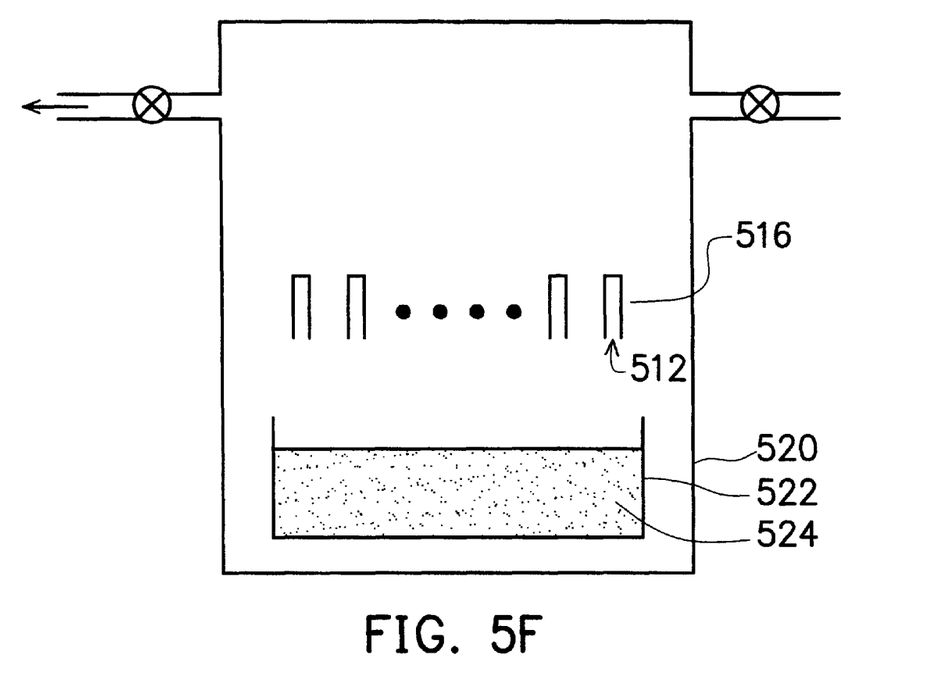

Referring to the step 410 in FIG. 4 and FIG. 5F, a vacuum cavity 520 is provided. A glue tub 522 containing packaging material 524 is also provided in the vacuum cavity 520. The packaging material 524 comprises, for example, ultra-violet curing glue or thermal curing glue. The package 516 is disposed in the vacuum cavity 520 by removing from the environment 530. The air is pumped out of the vacuum cavity 520, such that both the package 516 and the packaging material 524 are vacuumed. Meanwhile, the opening 512 of the packaging is facing the glue tub 522 while the glue tub 522 is not in contact with the packaging material 524.

Figure 5G:
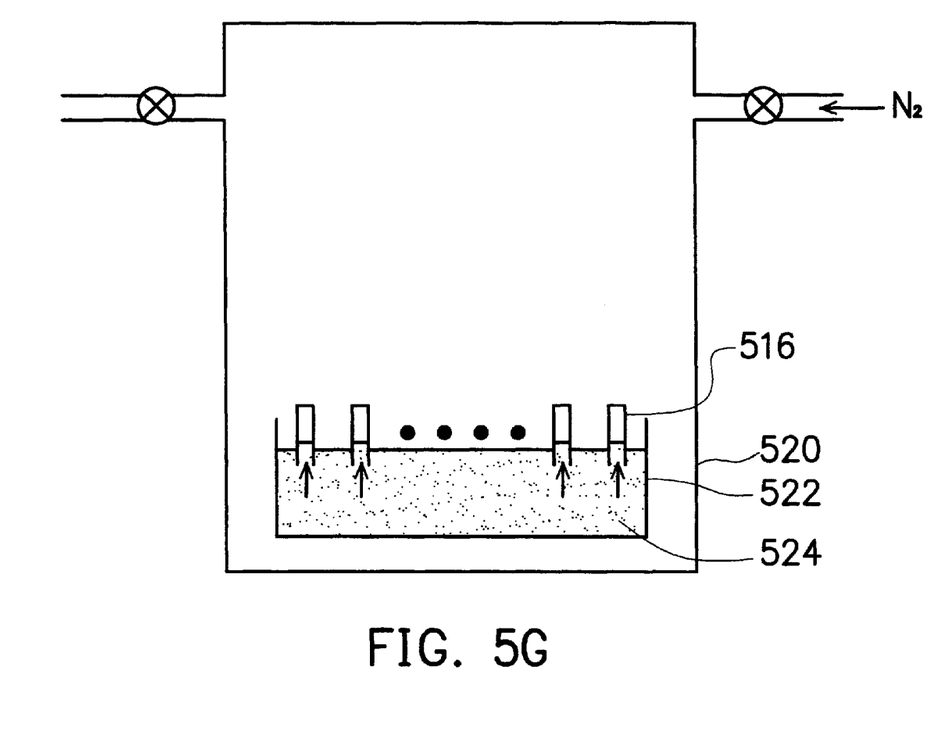

Referring to the step 412 in FIG. 4 and FIG. 5G, when the pressure in the vacuum cavity 520 is less than a certain value, for example, smaller than 1 atm, the latitude of the package 516 is reduced until the opening 512 is immersed in the packaging material 524. According to the capillary theory, the cavity 518 in the package 516 is filled with the packaging material 524. A dry air, for example, highly pure nitrogen is conducted into the vacuum cavity 520 to raise the pressure therein. For example, the pressure is raised up to 1 atm. In this manner, there is a pressure difference between the cavity 518 and vacuum cavity 520 outside of the package 516. Thus, the packaging material 524 are continuously injected into the cavity 518 until the cavity 518 is full of the packaging material 524a. The injection mechanism of the packaging material 524 does not cause any air bubbles which affect the performance and lifetime of the electro-luminescence devices.

Figure 5H:
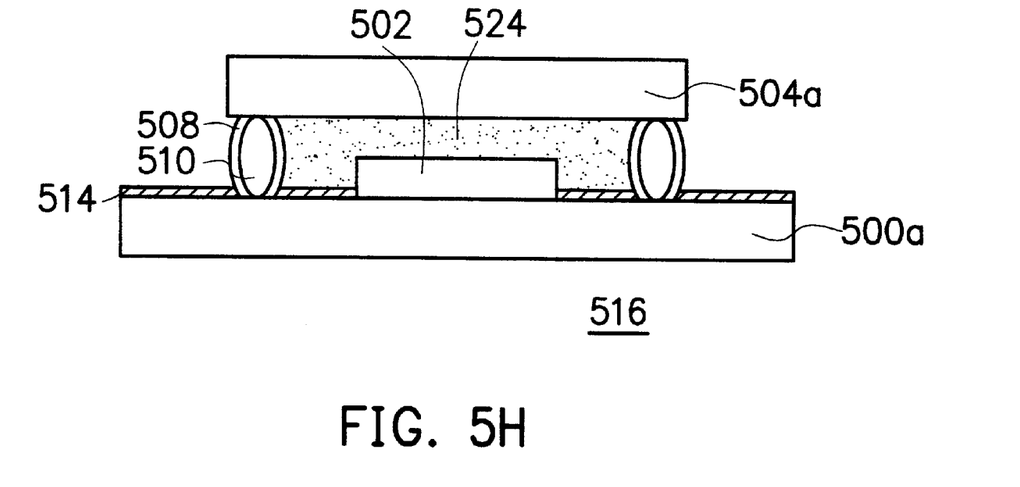

Referring to the step 414 in FIG. 4 and FIG. 5H, the packaging material 524a filling the cavity 518 of the package 516 is cured. Again, if the UV glue is selected as the packaging material 524a, an UV light is used to shine on the packaging material 524a. If the thermal curing material is used, a thermal curing step is performed, or alternatively, the packaging material 524a can be cured naturally.

Second Embodiment

Figure 7:
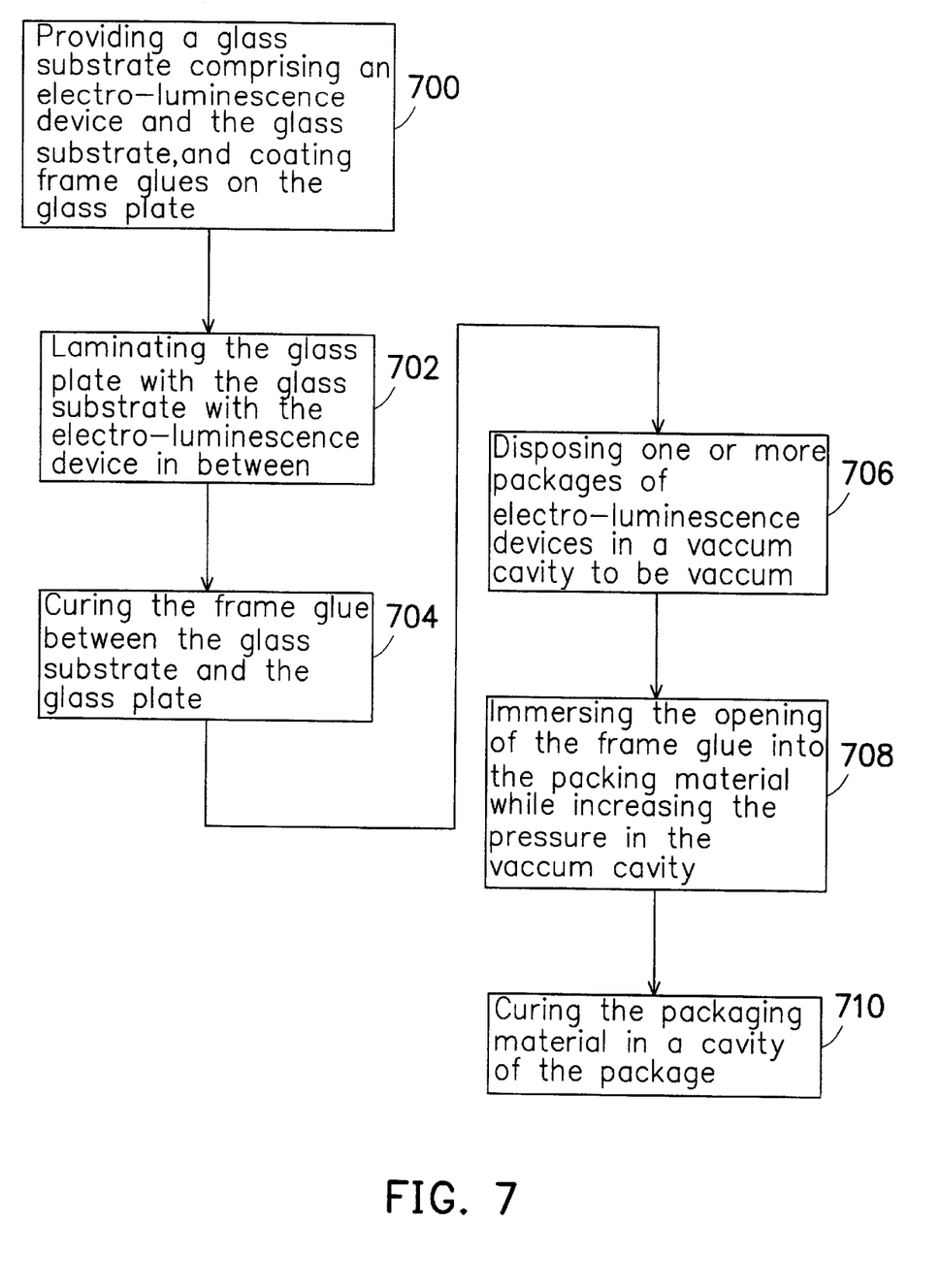
FIG. 7 shows a packaging process for a large area electro-luminescence display of a second embodiment according to the invention.

In this embodiment, a packaging method for electro-luminescence devices applicable for use in large area display is provided. In FIG. 7, a process flow of this packaging method is shown. FIG. 8A to FIG. 8F shows the process of the packaging method as illustrated in FIG. 7. The steps 700 to 710 in FIG. 7 corresponds to the steps as shown in FIG. 8A to FIG. 8F, respectively.

Figure 8A:
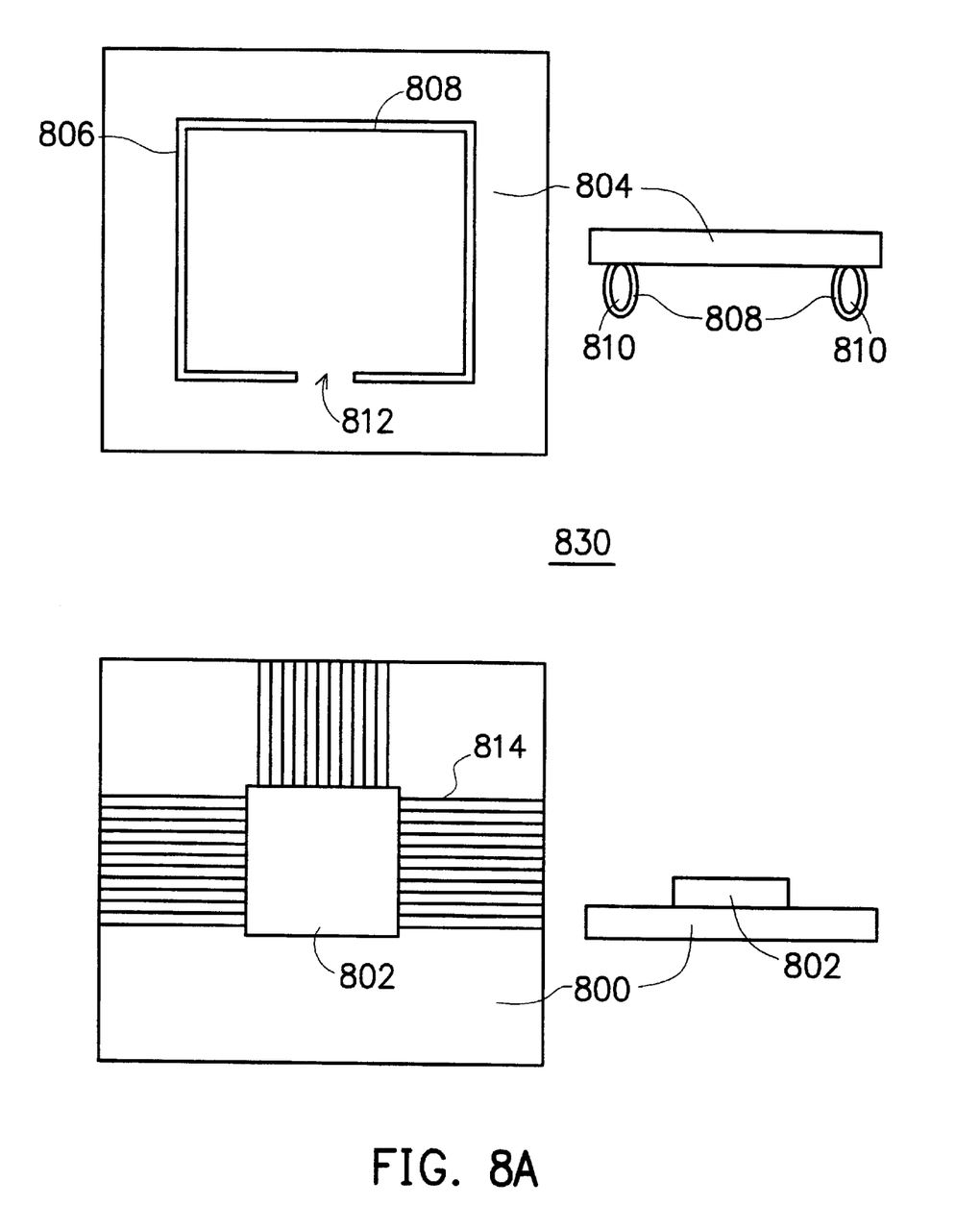
FIGS. 8A–8F shows the electro-luminescence device of the second embodiment.

As shown as the step 700 in FIG. 7 and the step in FIG. 8A, an environment 830 with moisture and oxygen concentrations under control is selected. A glass substrate 800 and a glass plate 804 are provided in the environment 830. A large area electro-luminescence device 802 is formed on the glass substrate 800. At a peripheral of the electro-luminescence device 802 on the glass substrate 800, circuits 814 are formed to carry out the electrical connections between the electro-luminescence device 802 and external devices. At a frame position 806 of the glass plate 804, a frame glue is 808 is formed with an opening 812. This frame position 806 is to correspond with the peripheral of the electro-luminescence device 802, while the opening 812 is positioned to align over one side of the electro-luminescence device 802 that has no circuits 814 formed thereon. The electro-luminescence device 802 comprises organic electro-luminescence device, for example, the organic light-emitting device as shown in FIG. 6. In addition, a spacer 810 is included in the frame glue 808.

Figure 8B:
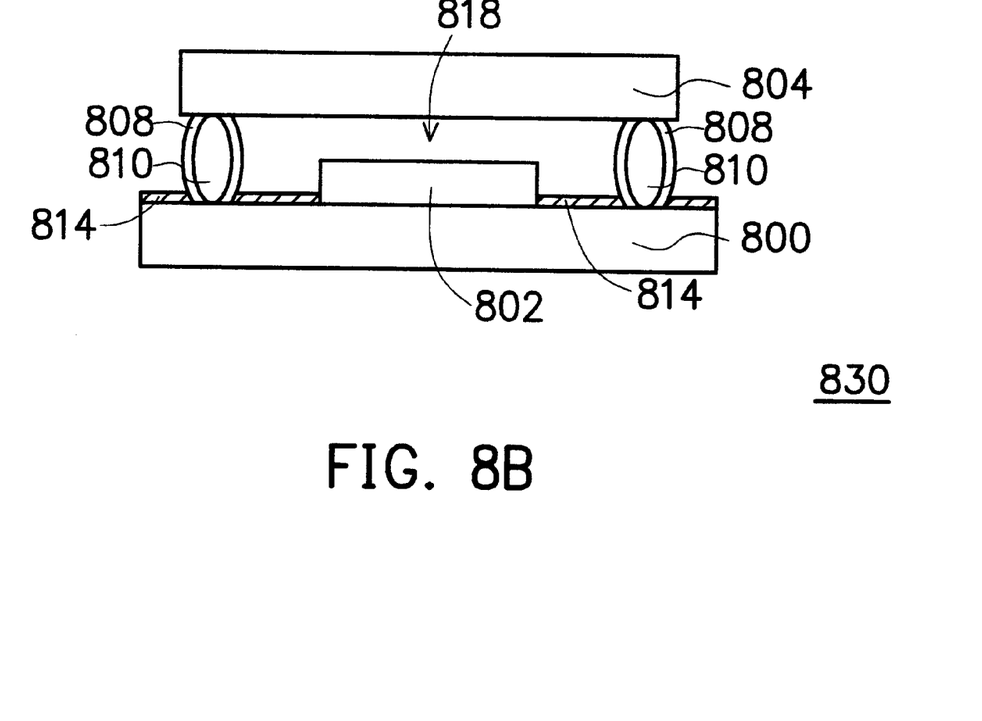

Referring to step 702 in FIG. 7 and FIG. 8B, with the moisture and oxygen concentrations under control in the environment 830, the glass plate 804 is laminated with glass substrate 800. The electro-luminescence device 802 is thus enclosed by the glass substrate 800, the glass plate 804 and the frame glue 808 except that the side that has no circuit is exposed to the environment 830 via the opening 812. The spacer 810 is used to control the distance glass substrate 800 and the glass plate 804.

Figure 8C:
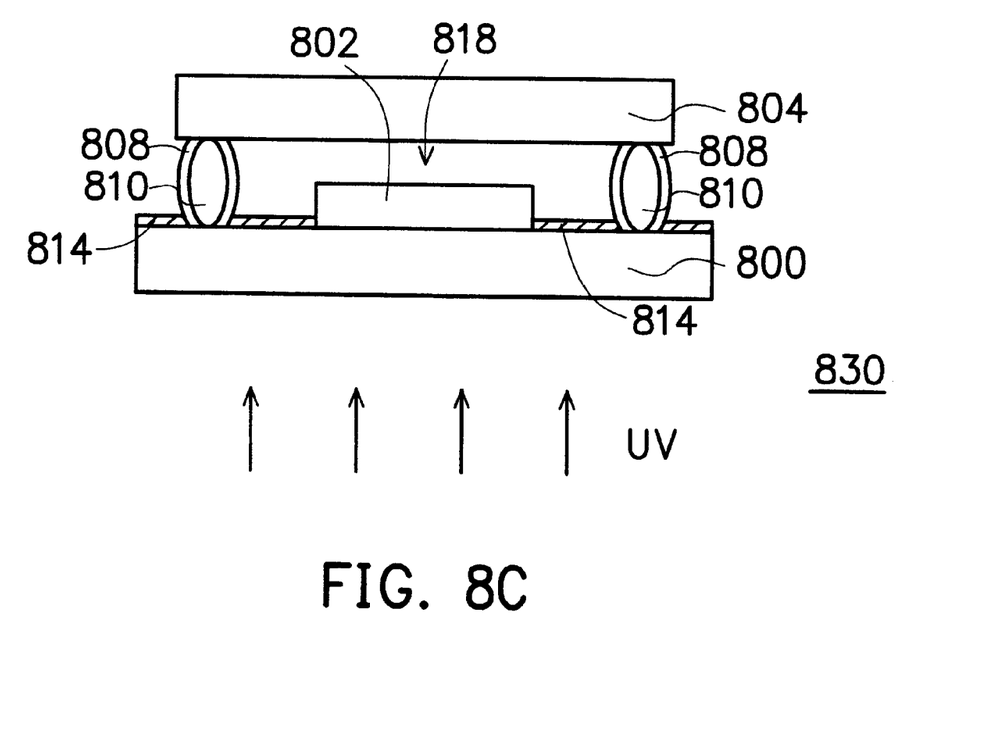

Referring to the step 704 in FIG. 7 and FIG. 8C, still, in the environment 830, the frame glue 808 is cured. If an ultra-violet glue is used as the frame glue 808, an ultra-violet light is used. If a thermal curing material is used, both the ultra-violet curing type glue and an ultra-violet light are required. The glass plate 804 and the glass substrate 800 are positioned and laminated with each other. Using a thermal baking step or natural hardening step, the frame glue 808 is cured. Thus constructed, a package 816 comprising the electro-luminescence device 802 is formed.

Figure 8D:
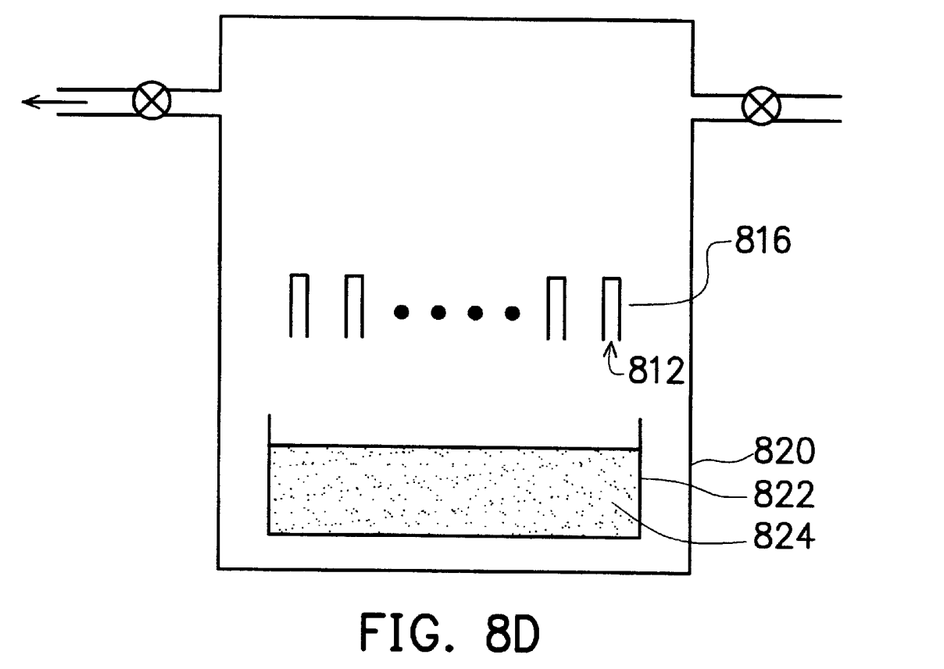

In the step 706 of FIG. 7 and FIG. 8D, similar to the step 410 in FIG. 4, a vacuum cavity 820 comprising a glue tub 822 on a bottom surface thereof is provided. The glue tub 822 comprises packaging material 824 therein. One or more than one packages 816 can be disposed in the vacuum cavity 820 with the opening 812 facing the glue tub 822, however, without being in contact with the packaging material 824.

Figure 8E:
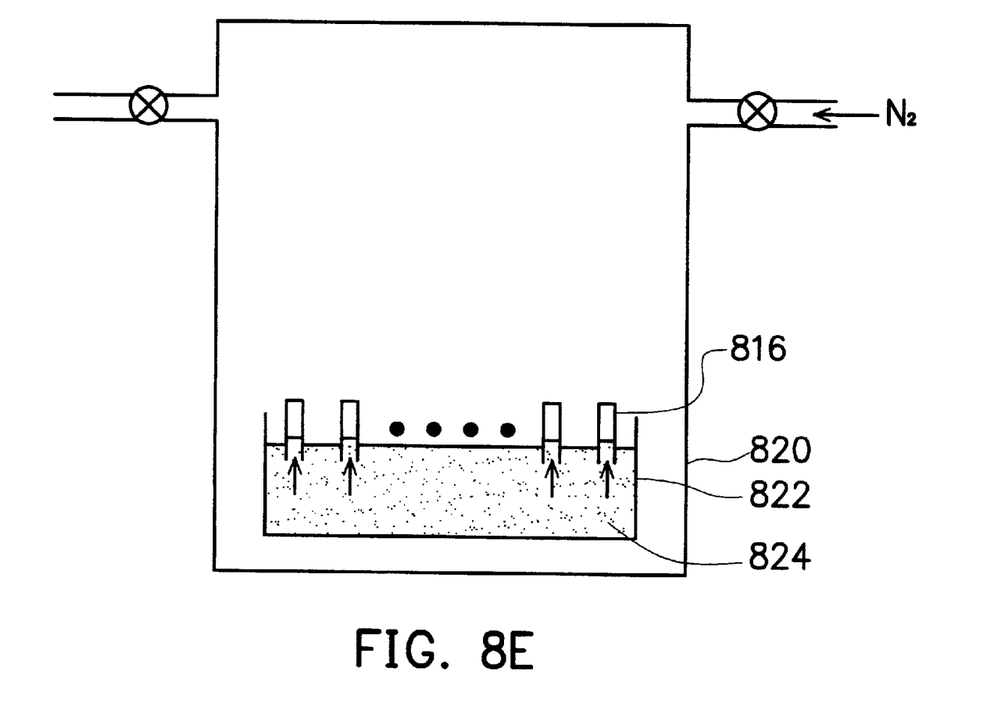

In the step 708 of FIG. 7 and FIG. 8E, when the pressure in the vacuum cavity 820 reaches a certain value, the package 816 is immersed or dipped into the glue tub 822. The packaging material 824 is thus injected into a space or cavity 818 between the glass substrate 800 and the glass plate 804 enclosed by the frame glue 808.

Figure 8F:
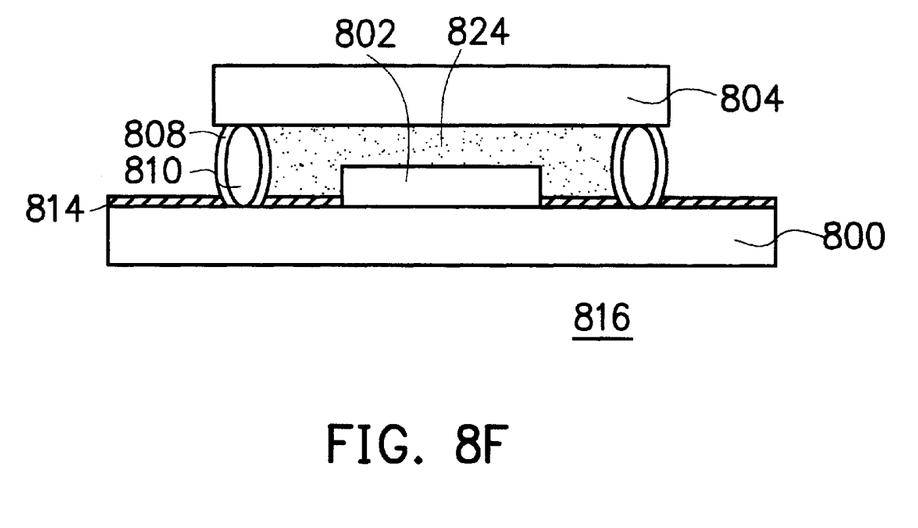

In the step 710 of FIG. 7 and FIG. 8F, similar to the step 704, the packaging material 824a filling the cavity 818 is cured by either ultra-violet light or thermal step.

From the above embodiments, the invention provides a packaging method for electro-luminescence devices in an environment of which the moisture and oxygen concentrations are controlled. Thus, the moisture and oxygen can be effectively blocked from entering the package to affect the device quality or performance of the electro-luminescence devices. The spacer is added into the frame glue to control the quantity of glue, so that the uniformity of the glue can be improved. In addition, the space between the glass plate and the glass substrate can be maintained at a certain value such that an overfill of the glue is avoided. The problem for covering the connection between the electro-luminescence device and the external devices is resolved.

By applying the pressure difference inside and outside of the package, the packaging material is filled into the cavity of package with causing the bubbles. The performance and lifetime for the electro-luminescence devices are enhanced and elongated. Moreover, more than one packages of electro-luminescence devices can be disposed in the vacuum cavity for the packaging material filling step, so that the yield of product, the production efficiency are promoted, while the fabrication cost is decreased.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A packaging method of electro-luminescence devices, comprising:

provided a glass substrate comprising a plurality of electro-luminescence devices and a glass plate in an environment with a moisture concentration and an oxygen concentration under control;

coating a frame glue on each position on the glass plate corresponding to each electro-luminescence device on the glass substrate in the environment, wherein each frame glue comprises an opening;

laminating the glass plate with the glass substrate in the environment to have each electro-luminescence device enclosed by the corresponding frame glue except that one side of each electro-luminescence device without having a circuit is exposed to the environment via the opening;

curing the frame glue in the environment;

cutting the glass substrate into a plurality of individual packages in the environment, each of the package comprising one of the electro-luminescence devices in a cavity enclosed by one part of the glass plate, one part of the substrate and one of the frame glues except from the openings;

disposing the packages into a vacuum cavity having a glue tub, the glue tub comprising a packaging material and the openings of packages facing the packaging material without being in contact with;

pumping air from the vacuum cavity to vacuum the packages and the packaging material;

immersing the openings into the packaging when a pressure of the vacuum cavity reaches a certain value, so that the packaging material is injected to fill the cavity; and curing the packaging material in each of the packages.

2. The packaging method according to claim 1, wherein the moisture and the oxygen concentrations are controlled under 1 ppm in the environment.

3. The packaging method according to claim 1, comprising the step of providing the electro-luminescence devices made of organic electro-luminescence materials.

4. The packaging method according to claim 1, comprising the step providing organic light-emitting diodes as the electro-luminescence devices.

5. The packaging method according to claim 1, comprising the step of coating the frame glues added with spacers on the glass plate.

6. The packaging method according to claim 1, comprising using thermal curing glues as the frame glues.

7. The packaging method according to claim 6, comprising the step of curing the frame glues by a thermal curing step.

8. The packaging method according to claim 6, comprising the step of curing the frame glues by a naturally curing step.

9. The packaging method according to claim 1, comprising using ultra-violet curing glues as the frame glues.

10. The packaging method according to claim 9, comprising the step of curing the frame glues by a shining an ultra-violet light on the frame glues.

11. The packaging method according to claim 1, comprising using a cutting machine to cut the glass substrate.

12. The packaging method according to claim 1, comprising using a thermal curing glue as the packaging material.

13. The packaging method according to claim 1, comprising the step of using an ultra-violet curing glue as the packaging material.

14. The packaging method according to claim 1, comprising raising the pressure in the vacuum cavity up to larger than 1 atm in the step of infilling the packaging material into the cavity.

15. The packaging method according to claim 1, wherein the step of raising the pressure in the vacuum cavity comprises conducting an dry into the vacuum cavity.

16. The packaging method according to claim 15, wherein the step of conducting the dry air into the vacuum cavity comprising conducting highly pure nitrogen into the vacuum cavity.

17. The packaging method according to claim 1, wherein the value of the pressure is set at about 1 atm.

18. The packaging method according to claim 1, comprising the step of using a thermal curing glue as the packaging material.

19. The packaging method according to claim 18, comprising the step of thermal curing for curing the packaging material.

20. The packaging method according to claim 18, comprising the step of naturally curing for curing the packaging material.

21. The packaging method according to claim 13, comprising the step of using a ultra-violet curing glue as the packaging material.

22. The packaging method according to claim 21, comprising the step of shining an ultra-violet light on the packaging material for curing the packaging material.

23. A packaging method for an electro-luminescence device, comprising:

providing a glass substrate comprising an electro-luminescence devices thereon and a glass plate in an environment with a moisture concentration and an oxygen concentration under control;

coating a frame glue on the glass plate at a position aligned with a peripheral of the electro-luminescence device on the glass substrate in the environment, wherein the frame glue comprises an opening;

laminating the glass plate with the glass substrate in the environment to have the electro-luminescence device enclosed by the frame glue except that one side of electro-luminescence device is exposed to the environment via the opening, so that a package including the electro-luminescence device in a cavity enclosed by the glass substrate, the glass plate, the frame glue is formed;

disposing at least one of the package into a vacuum cavity having a glue tub, the glue tub comprising a packaging material and the opening of package facing the packaging material without being in contact with;

pumping air from the vacuum cavity to vacuum the package and the packaging material;

immersing the opening into the packaging when a pressure of the vacuum cavity reaches a certain value, so that the packaging material is injected to fill the cavity; and curing the packaging material in each of the package.

24. The packaging method according to claim 23, wherein the moisture and the oxygen concentrations are controlled under 1 ppm in the environment.

25. The packaging method according to claim 23, comprising the step of providing the electro-luminescence device made of organic electro-luminescence materials.

26. The packaging method according to claim 23, comprising the step of coating the frame glue added with spacer on the glass plate.

27. The packaging method according to claim 23, comprising using a thermal curing glue as the frame glue.

28. The packaging method according to claim 23, comprising the step of curing the frame glue by a thermal curing step.

29. The packaging method according to claim 23, comprising the step of curing the frame glue by a naturally curing step.

30. The packaging method according to claim 23, comprising using ultra-violet curing glues as the frame glue.

31. The packaging method according to claim 30, comprising the step of curing the frame glues by a shining an ultra-violet light on the frame glues.

32. The packaging method according to claim 23, comprising using a thermal curing glue as the packaging material.

33. The packaging method according to claim 23, comprising the step of using an ultra-violet curing glue as the packaging material.

34. The packaging method according to claim 23, comprising raising the pressure in the vacuum cavity up to larger than 1 atm in the step of infilling the packaging material into the cavity.

35. The packaging method according to claim 23, wherein the step of raising the pressure in the vacuum cavity comprises conducting an dry into the vacuum cavity.

36. The packaging method according to claim 35, wherein the step of conducting the dry air into the vacuum cavity comprising conducting highly pure nitrogen into the vacuum cavity.

37. The packaging method according to claim 23, wherein the value of the pressure is set at about 1 atm.

38. The packaging method according to claim 23, comprising the step of using a thermal curing glue as the packaging material.

39. The packaging method according to claim 38, comprising the step of thermal curing for curing the packaging material.

40. The packaging method according to claim 38, comprising the step of naturally curing for curing the packaging material.

41. The packaging method according to claim 23, comprising the step of using a ultra-violet curing glue as the packaging material.

42. The packaging method according to claim 41, comprising the step of shining an ultra-violet light on the packaging material for curing the packaging material.

* * * * *